March 19, 1963 T. M. CORRY ET AL 3,082,276

THERMOELECTRIC APPLIANCE

Filed Aug. 17, 1960

3,082,276
THERMOELECTRIC APPLIANCE

Thomas M. Corry, Monroeville, and Leland L. Learn, Apollo, Pa., assignors to Westinghouse Electric Corporation, East Pittsburgh, Pa., a corporation of Pennsylvania Filed Aug. 17, 1960, Ser. No. 50,196
1 Claim. (Cl. 136—4)

This invention relates to a new thermoelectric appliance, particularly to a cooking appliance having in combination therewith a thermoelectric generator capable of producing electric current for use by an associated, remotely located, consuming device.

More specifically, this invention concerns a portable vessel, or pot, adapted to contain a volatile fluid useful for cooking purposes, such as a pot for boiling water, which has contained therein a thermoelectric system, or array, capable of utilizing a phenomenon known as the Seebeck Effect in the generation of electrical energy. The Seebeck Effect is achieved in an electrical circuit formed of two dissimilar materials by maintaining one junction between the materials at a higher temperature than another junction between the materials. The vessel of this invention is adapted to be heated through its bottom wall by placing it on a combustion heating source, such as a petroleum fluid burner. The thermoelectric generator system in the vessel has its hot junction structure, or structures, arranged in heat transfer relationship with the bottom of the vessel so as to receive heat from the heat source. The cold junction structure, or structures, of the thermoelectric generator are arranged in heat transfer relationship with the volatile fluid contained by the vessel and which is utilized as a heat sink to remove heat from the cold junction structures and maintain these structures at a temperature lower than the temperature of the hot junction structures. A temperature differential is thereby provided across the thermoelectric generator, which induces the generator to produce a useful electric current.

Electric current generated in the appliance is delivered therefrom by electrically insulated conducting means which exit, or leave, the vessel in a region thereof which is remote from the heat source, preferably through a handle for the appliance, so as to reduce the likelihood of the conductor being damaged by heat from the heat source. The quantity of electric energy generated is sufficient to power a portable current consuming appliance, such as, for example, an electric fan, a radio, or an electric shaver.

It is a feature of this invention that heat which invariably flows through the thermoelectric generator from the hot junction side to the cold junction side thereof is utilized to elevate the temperature of the cooking fluid within the vessel. Inasmuch as the vessel contains a volatile fluid, a definite limitation is placed upon the temperature rise of the cold junction side of the thermoelectric generator, which insures proper operation of the generator through maintenance of a minimum temperature differential across the generator.

The new appliance of this invention finds particular usefulness as an item of camping or emergency equipment usable in remote regions where a central electrical supply system is unavailable or under emergency conditions rendering it likely that such central supply systems are not functioning.

Additional features, advantages and objects of the invention will be apparent from the following detailed description thereof, wherein reference is made to the accompanying drawings, in which.

Figure 1:
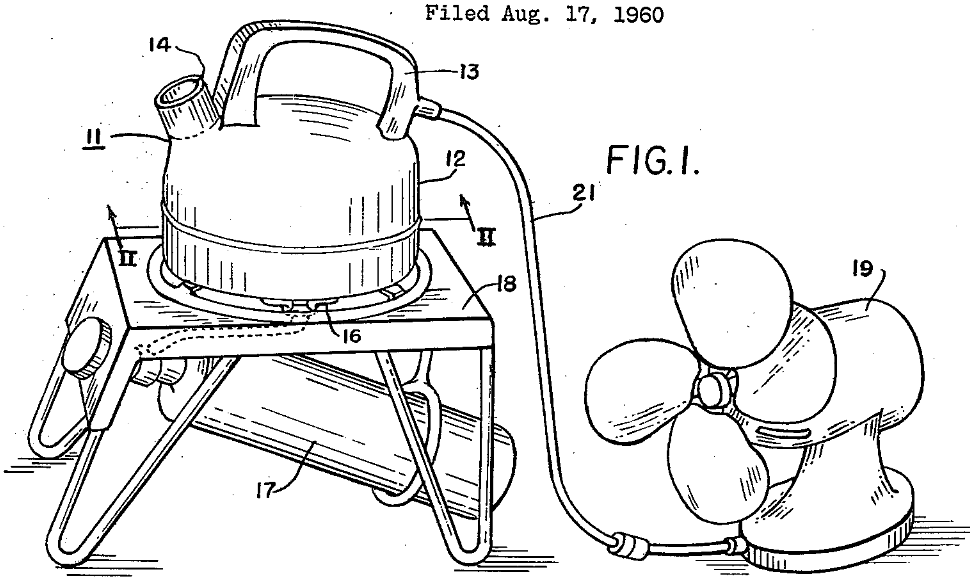
FIG. 1 is a perspective illustration of a thermoelectric appliance constructed in accordance with this invention showing one manner in which the appliance may be used.

In FIG. 1, the thermoelectric appliance of this invention is designated generally by reference numeral 11 and, in the form shown, comprises a vessel, or pot, 12 having a heat insulating handle 13 by which the vessel may be moved from one location to another, and a pouring and filling spout 14 by which a volatile fluid, such as water, may be introduced into and poured from the vessel 12.

As shown, vessel 12 is adapted to be positioned over a combustion heat source comprising a burner 16 and a supply tank 17 containing burnable petroleum fluid for consumption by the burner 16. The heat source shown in FIG. 1 is of a variety commonly used by campers and includes a stand 18 for supporting the elements of the heat source and the item to be heated, in this case, vessel 12.

Also illustrated in FIG. 1 is an electric fan 19 which, for purposes of understanding this invention, is representative of current consuming devices capable of utilizing electric current generated in thermoelectric appliance 11. Fan 19, or such other current consuming device as may be used, is connected to thermoelectric appliance 11 by suitable electric current conductor means 21.

Figure 2:
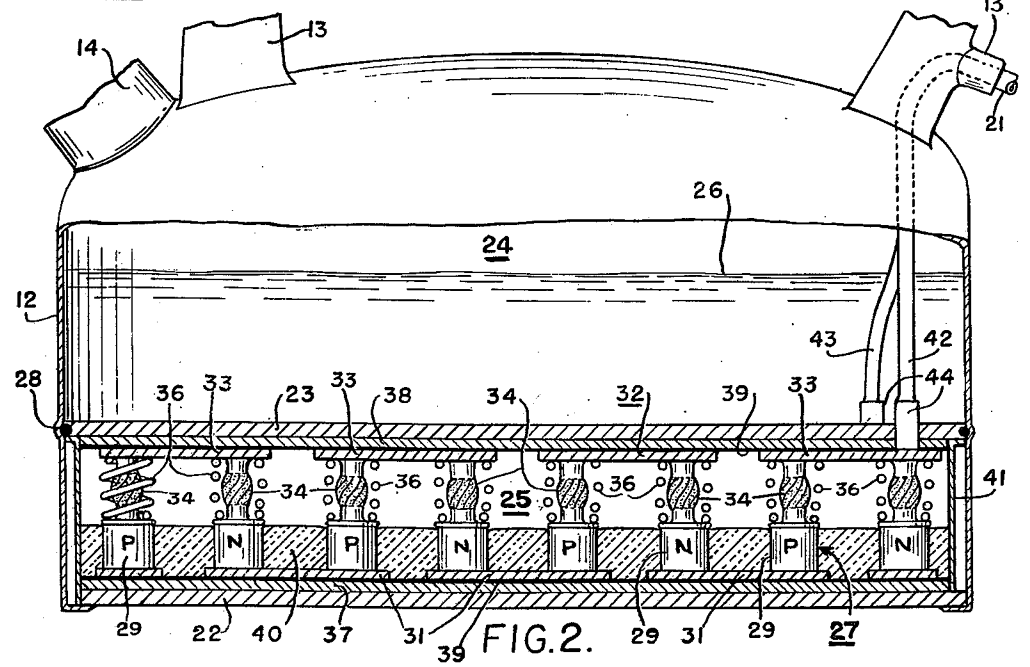
FIG. 2 is an enlarged view of the appliance from which portions have been broken away to show the interior thereof.

The details of construction of the thermoelectric appliance 11 are illustrated in FIG. 2, from which it is to be noted that vessel 12 has a bottom wall member 22 which is formed of sheet metal or other good heat conducting material. Inasmuch as the bottom of the vessel 12 is exposed to relatively high temperatures, it is preferable that bottom wall member 22 be made of corrosion-resistant material, such as stainless steel. Arranged within vessel 12 is another, or intermediate, wall member 23 which is spaced above and preferably disposed parallel to bottom wall member 22. Intermediate wall member 23 divides vessel 12 into two chambers, or sections 24 and 25, which are adapted to house, or contain, respectively, a volatile fluid 26, such as water, and a thermoelectric generator identified generally by reference numeral 27. The periphery of wall member 23 is disposed in sealing relationship with the side wall portions of vessel 12 for the purpose of preventing leakage of fluid 26 from chamber 24. If desired, this sealing relationship can be achieved through the use of an O-ring sealing member 28 compressed between the edge of wall member 23 and the side wall portions of vessel 12. Chamber 24 of vessel 12 is, of course, in open communication with spout 14 for the purpose of admitting and discharging fluid 26 from chamber 24. In addition, spout 14 provides a vent for the escape of such fluid 26 as may be vaporized by heating.

Thermoelectric generator 27, which is located in the lower section of vessel 12, comprises an array, or system, of thermoelectric bodies 29 alternately formed of two materials having dissimilar thermoelectric properties. The two types of thermoelectric bodies are distinguished by the characters N and P, indicating in semi-conductor terminology that the respective bodies are formed of materials having negative or positive thermoelectric characteristics. Semi-conductor thermoelectric materials are preferably employed for bodies 29, although it is well well known that other materials, such as, for example, iron and constantan, are available which are capable of functioning in thermoelectric generating apparatus.

The thermoelectric generator 27 further includes conducting members 31 which electrically connect different pairs of N and P thermoelectric bodies 29 to form hot junction portions of the generator. Cold junction portions of the generator are provided by other conducting structures 32 comprising connector straps 33 formed of electrically and thermally conductive material, and flexible connectors 34 which are joined to straps 33 and conduct heat from and electricity to individual thermoelectric bodies 29. Conducting structures 32 connect different pairs of thermoelectric bodies 29 than do conducting members 31 in such a manner that all of the thermoelectric bodies, the conducting members 31 and the conducting structures 32 are connected in a series electrical circuit (see FIG. 3).

The cold junction structures 32 of the thermoelectric system may include compression springs 36, each of which surrounds a flexible conductor 34 for the purpose of biasing the cold junction structures away from the hot junction conducting members 31 and into good thermal contact with heat transfer apparatus associated respectively therewith. The flexible and spring biased junction structure shown forms no part of the present invention, but is described in greater detail and claimed in an application by Robert A. Ramey, Jr., and Thomas M. Corry, Serial No. 12,427, filed March 2, 1960, entitled "Thermoelectric Assembly," and assigned to the same assignee as this invention.

In the thermoelectric generator illustrated in FIG. 2, hot junction conducting members 31 are in thermal transfer relationship with bottom wall member 22 of the vessel 12, and a sheet 37 of high heat conductive material, such as aluminum, may be disposed between wall member 22 and conducting members 31 for the purpose of conveying heat from the entire surface area of wall member 22 to the individual conducting members 31. A similar conducting sheet 38 may be disposed between cold junction structures 32 and intermediate wall member 23 for the purpose of facilitating the transfer of heat from cold junction structures 32 to wall member 23 and into the body of fluid 26 in vessel 12. In keeping with conventional design practice for thermoelectric generators, the thermoelectric array is electrically insulated from adjacent, electrically conductive structure by means of sheets, or layers, 39 of electrical insulation material. Electrically insulating layers 39 are preferably made as thin as is practicable so as to minimize the resistance which such layers offer to the flow of heat to and from the generator 27. In addition, a body of thermal insulation 40 may be disposed in the generator for the purpose of reducing heat leakage from its hot junction structures to its cold junction structures.

The space between edge portions of the vessel bottom wall member 22 and the intermediate wall member 23 is preferably closed by a sheet 41 of low heat conductive material. A thin sheet of stainless steel is preferred for this application inasmuch as it offers good resistance to deterioration from heating. The edges of sheet 41 may be welded or otherwise sealed to wall members 22 and 23, respectively, so as to provide a sealed enclosure for the thermoelectric generator 27, which enclosure protects the components of the generator from deleterious attacks of moisture, and from the flame and combustion products thereof, from the heat source with which the appliance is used.

Figure 3:
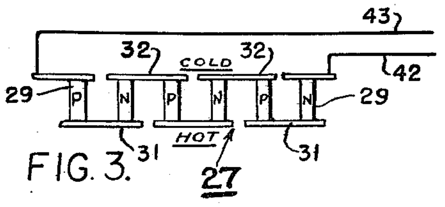
FIG. 3 is a schematic diagram of the thermoelectric generator embodied in the appliance.

Electric current is conveyed from thermoelectric generator 27 by means of insulated conductors 42 and 43 which are connected to the thermoelectric system in the manner illustrated in FIG. 3. Conductors 42 and 43 preferably have an insulated coating or covering thereover which enables them to extend up through the body of fluid 26 in vessel chamber 24 in a manner to leave vessel 12 through a hollow portion of the vessel's insulated handle 13 (see FIG. 2). By this arrangement, conductors 42 and 43 exit vessel 12 and form conductor means 21 in a region of the vessel which is remote from the heat source applying heat to the bottom of the vessel, so that the likelihood of conductor means 21 being damaged by such heat is minimized.

Conductors 42 and 43 are also preferably sealed to, but electrically insulated from, intermediate wall member 23 in the region in which they pass through this wall member. Glass sealed, lead-through connectors illustrated at 44 may be employed for this purpose.

In operation, the thermoelectric appliance 11 is placed on a combustion heat source in such a position that its bottom wall member 22 receives heat from that source. The body of fluid 26 in vessel 12 functions as a heat sink to maintain the cold junction portion of thermoelectric generator 27 at a lower temperature than the hot junction portion, which is in heat transfer relation with vessel bottom wall 22. The temperature differential maintained across the thermoelectric generator causes electric current to be generated in the generator by virtue of the Seebeck phenomenon of electric current generation. During operation of the thermoelectric generator by which electric current is conveyed from the generator to a consuming device, such as fan 19, some heat will flow through the generator and be absorbed by the body of fluid 26 in the vessel 12. The rise in temperature of the cold junction portion of generator 27 is limited by virtue of the fact that heat conveyed to fluid 26 which is in excess of that capable of heating the fluid to its vaporization temperature will be rapidly dissipated from vessel 12 as a result of vaporization of the fluid and the escape of such vapor through spout 14 of the vessel. As is well understood, the temperature of a boiling fluid does not rise appreciably above the vaporization temperature of that fluid regardless of the amount of heat applied to the fluid, so that, in the case of this appliance, fluid 26 is capable of preventing an undue rise in temperature in the cold junction portion of thermoelectric generator 27, thereby assuring efficient operation of the generator.

It should be appreciated that heat flowing through thermoelectric generator 27 is not wasted as it has been in prior generating apparatus, but performs the useful function of raising the temperature of the fluid 26, which can thereafter be used for cooking purposes or put to such other uses as may be desired.

From the foregoing, it should be apparent that this invention provides a new appliance capable of performing the dual useful function of power generation and fluid heating for cooking and other purposes.

While the invention has been shown in but one form, it will be obvious to those skilled in the art that it is not so limited, but is susceptible of various changes and modifications without departing from the spirit thereof.

What is claimed is:

In a portable vessel adapted for boiling water when placed over a heat source and for concurrently generating an electrical current, a casing having an opening at the top thereof into which water may be introduced, the casing having a bottom wall adapted to be placed over a heat source and a second parallel spaced wall, the water being disposed in the casing above said second wall, the two walls forming a sealed chamber separated from the water containing portion of the casing, a thermoelectric system comprising a plurality of thermoelectric bodies disposed in said sealed chamber, each body having a flexible conductor extending from one end and terminating in a solid member having good electrical and thermal conductivity, a resilient biasing means disposed between each body and its solid members to separate them with respect to each other, the space between the bottom wall and the second wall being such that the solid member and the thermoelectric bodies are pressed into firm contact therewith by the resilient biasing means whereby good thermal contact is obtained, electrical and thermal insulation disposed around the thermoelectric bodies, electrical conductor means in contact with the bottom wall connecting the lower portions of pairs of the thermoelectric bodies of the system whereby they are connected in an electrical circuit, and electrical leads passing from the thermoelectric system through said casing to the exterior of the vessel thereby to conduct electrical current generated by the system when heat is applied to the bottom wall and conducted by the thermoelectric bodies and electrical conductors to the said second wall and thence to the water.

References Cited in the file of this patent

UNITED STATES PATENTS

| | | |
|---|---|---|
| 420,764 | Bradley | Feb. 4, 1890 |
| 1,848,655 | Petrik | Mar. 8, 1932 |
| 2,886,618 | Goldsmid | May 12, 1959 |
| 2,987,564 | Imelmann | June 6, 1961 |
| 2,996,889 | Roeder | Aug. 22, 1961 |

OTHER REFERENCES

| | | |
|---|---|---|
| 9,741 | Great Britain | 1843 |